United States Patent [19]
Nishio

[11] Patent Number: 5,567,652
[45] Date of Patent: Oct. 22, 1996

[54] METHOD FOR MANUFACTURING SEMICONDUCTOR DEVICE COMPRISING COBALT SILICIDE FILM

[75] Inventor: Naoharu Nishio, Tokyo, Japan

[73] Assignee: NEC Corporation, Japan

[21] Appl. No.: 533,160

[22] Filed: Sep. 25, 1995

[30] Foreign Application Priority Data

Oct. 14, 1994 [JP] Japan .................... 6-249219

[51] Int. Cl.$^6$ .................................. H01L 21/283
[52] U.S. Cl. .................. 437/200; 437/192; 437/195; 437/201; 437/239
[58] Field of Search .................... 437/195, 200, 437/201, 41 SM, 239, 192; 148/DIG. 19, DIG. 147; 257/758

[56] References Cited

U.S. PATENT DOCUMENTS

| | | | |
|---|---|---|---|
| 4,784,973 | 11/1988 | Stevens et al. | 437/200 |
| 5,047,367 | 9/1991 | Wei et al. | 437/200 |
| 5,194,405 | 3/1993 | Sumi et al. | 437/200 |
| 5,397,744 | 3/1995 | Sumi et al. | 437/200 |
| 5,399,526 | 3/1995 | Sumi | 437/190 |
| 5,449,642 | 9/1995 | Tan et al. | 437/200 |

FOREIGN PATENT DOCUMENTS 5-166752  7/1993  Japan .

OTHER PUBLICATIONS

"Nanoscal CoSi$_2$Contact Layer Growth From Deposited Co/Ti Multilayers on Si Substrates"; Hong et al; Appl. Phys. Lett. 61(13), Sep. 28, 1992; pp. 1519–1521.

"Epitaxial Growth of CoSi$_2$ on Both (111) and (100) Si Substrates by Multistep Annealing of a ternary Co/Ti/Si System": Liu et al; J. Appl. Phys. 74(3), Aug. 1, 1993; pp. 1700–1706.

"Resistance and Structural Stabilities of Epitaxial CoSi$_2$Films on (001) Si Substrates": Hsia et al; J. Appl. vol 72, No. 5; Sep. 1, 1992; pp. 1864–1873.

"Formation of Epitaxial CoSi$_2$Films on (001) Silicon Using Ti–Co Alloy and Bimetal Source Materials"; Hsia et al; J. Appl. Phys. vol. 70, No. 12; Dec. 15, 1991; pp. 7579–7587.

Ghandhi, S. K., VLSI Fabrication Principles, John Wiley & Sons, 1983, PP. 371–375.

*Primary Examiner*—T. N. Quach
*Attorney, Agent, or Firm*—Hayes, Soloway, Hennessey, Grossman & Hage, P.C.

[57] ABSTRACT

A method for manufacturing a semiconductor device which comprises a silicon single crystal substrate and a cobalt silicide film formed on the silicon single crystal substrate and equipped with a matched crystalline orientation reflecting the crystallinity of the silicon substrate. The present invention also discloses a method for manufacturing a desired semiconductor device comprising a substantially epitaxial and less uneven cobalt silicide film which comprises forming a Si oxide film on the surface of a Si substrate, further forming Ti and Co films, followed by heat treatment. This method provides a convenient process along with a cobalt silicide film which is less uneven in its surface and is excellent in crystal orientation can be selectively formed, and an effect that a contact can be formed which is less uneven and has a low contact resistance.

4 Claims, 5 Drawing Sheets

METHOD FOR MANUFACTURING SEMICONDUCTOR DEVICE COMPRISING COBALT SILICIDE FILM

BACKGROUND OF THE INVENTION

1. Field of the Invention:

The present invention relates to a semiconductor device having a high density formed at a high speed, and more specifically, it relates to a method for manufacturing a semiconductor device in which a metal silicide film is selectively formed on an Si substrate.

2. Description of the Related Art:

In recent years, with the miniaturization of semiconductor devices, the necessity of decreasing the depth of junctions in a diffusion layer has been strengthened more and more. However, the decrease of the junction depth causes the resistance of the diffusion layer to increase. Thus, as a technique for avoiding this disadvantage, a salicide process has been used in which a diffusion layer region alone is selectively made from a high-melting point metal silicide.

Typical examples of the high-melting point metal which can be used in this salicide process include Ti, Ni and Co. Among others, cobalt silicide has about the same lattice constant as that of Si and is excellent in lattice matching properties, and for this reason, cobalt silicide is expected as a high-melting point metal silicide for constituting a salicide structure in place of Ti silicide.

As a technique for improving the heat resistance of cobalt silicide, there has been a method which comprises making the solid phase epitaxial growth of cobalt silicide from a silicon substrate. However, it has been known that if cobalt is directly grown on the silicon substrate, polycrystallization occurs instead of the epitaxial growth.

The causes of this phenomenon are considered to be that if a heat treatment is carried out while cobalt is in direct contact with silicon, cobalt silicide which is not a disilicide is formed as an intermediate layer before a temperature for the heat treatment has been reached, and that a spontaneous oxide film of silicon remains in an interface between cobalt and silicon ["Journal of Applied Physics", Vol. 70, pp. 7579–7587 (1991)].

This spontaneous oxide film can be removed by a method which comprises sputtering titanium prior to the sputtering of cobalt onto the substrate to react the spontaneous oxide film present in the interface with Ti. This method utilizes means in which deposition is done so as to obtain a Co/Ti/Si laminate structure and a heat treatment is then carried out [e.g., "Journal of Applied Physics", Vol. 72 (5), pp. 1864–1873 (1992)].

In the case that this method is employed, a facet of cobalt silicide is observed in the interface between epitaxially grown cobalt silicide and the silicon substrate. The step of the interface attributed to this facet can be eliminated by a technique which comprises sputtering titanium onto the silicon single crystal substrate, sputtering cobalt thereonto, and further repeating this sputtering operation of titanium and cobalt plural times as shown in FIG. 1 to form a multiple laminate structure [e.g., "Applied Physics Letters", Vol. 61, pp. 1519–1521 (1992)]. However, this method has a problem that the process is complex.

Furthermore, as alternate means, Japanese Patent Application Laid-open No. 166752/1993 has described a method which comprises forming an oxide film on a silicon substrate by the thermal oxidation of silicon, and then forming titanium silicide. This method will be described with reference to FIG. 2.

As shown in FIG. 2A, there is formed an MOS transistor having an LDD structure which comprises a gate electrode 3 consisting of tungsten silicide 14 and polysilicon 15, an element separating region 6, a diffusion layer 5 and a sidewall 4. Next, a silicon film having a thickness of 3 nm is deposited all over, and a silicon oxide film 7 is then formed by the thermal oxidation.

Next, a titanium layer 8 having a thickness of about 30 nm is deposited all over [see FIG. 2B]. Afterward, RTA (rapid thermal annealing) which is a low-temperature thermal treatment is carried out at 650° C. for 30 seconds by the use of an inert gas to convert the titanium layer 8 into titanium silicide. Next, the laminate is immersed in a mixed aqueous solution of ammonia and hydrogen peroxide for 10 minutes to selectively etch and remove titanium which has not been converted into the silicide. According to this method, the diffusion layer region can be selectively converted into the silicide [see FIG. 2C].

In this disclosed method, the silicon oxide film is exclusively used for the purpose of forming a titanium silicide layer 16. In the case that cobalt is formed on the oxide film, such a silicide is scarcely formed.

SUMMARY OF THE INVENTION

In order to obtain a good cobalt silicide-silicon substrate interface, it is necessary to build up a multiple laminate structure as described above, which is accompanied by a problem that a process is complicated. Furthermore, since the reaction of silicon begins inconveniently before a temperature for a heat treatment step has been reached, a silicide other than a disilicide is formed, which deteriorates the shape of an interface between the silicon substrate and the disilicide finally formed by the phase transition of the other silicide. Therefore, it is necessary to retard the beginning of the reaction until a temperature at which the silicide is formed has been reached.

In the case that cobalt is directly grown on a silicon oxide film, this silicon oxide film scarcely reacts with cobalt, so that cobalt silicide cannot be formed.

The present invention has been attained with the intention of solving the above-mentioned problems, and an object of the present invention is to provide a method for selectively forming a cobalt silicide film which is less uneven and is excellent in crystalline orientation, and a method for manufacturing a semiconductor device which comprises the cobalt silicide film.

That is to say, the present invention is directed to a method for manufacturing a semiconductor device which comprises a silicon single crystal substrate and a cobalt silicide film formed on the silicon single crystal substrate and equipped with a matched crystalline orientation reflecting the crystallinity of the silicon substrate, said method comprising the steps of forming a Si oxide film on the surface of the silicon substrate, further forming a Ti film and a Co film thereon, and then carrying out a heat treatment to manufacture the desired semiconductor device comprising the substantially epitaxial and less uneven cobalt silicide film.

DETAILED DESCRIPTION OF THE INVENTION AND PREFERRED EMBODIMENTS

The above-mentioned object can be achieved by the present invention.

That is to say, the present invention is connected with a method for manufacturing a semiconductor device comprising a cobalt silicide film, said method comprising a step of forming an element separating region on a silicon single crystal substrate and then thermally oxidizing the region, a step of depositing a high-melting point metal in which the generated free energy of its oxide is lower than that of silicon oxide and then depositing Co, and a step of forming $CoSi_2$ only on a diffusion layer by a heat treatment.

The present invention has the following constitutions for the purpose of retarding the reaction of cobalt with silicon which tends to occur before a predetermined temperature has been attained:

(1) In the first place, an oxide film having a thickness of several nm is formed on a silicon substrate by thermal oxidation, and afterward, a high-melting point metal in which the generated free energy of its oxide is lower than that of silicon oxide is sputtered, and (2) cobalt is next sputtered, followed by a heat treatment.

In consequence, the silicon oxide film is reacted with the high-melting point metal in which the generated free energy of its oxide is lower than that of silicon oxide, so that the reaction of cobalt with silicon does not occur, until the silicon oxide film has been removed. Thus, the reaction of cobalt with silicon can be begun at a temperature at which cobalt disilicide is formed. Therefore, any intermediate layer is not formed, whereby a good cobalt silicide layer can be obtained.

In the present invention, a titanium layer and the silicon oxide film layer are present under a cobalt layer. Such a constitution can prevent the reaction of cobalt with silicon which tends to occur prior to the attainment of a predetermined temperature for the heat treatment step, whereby the formation of any intermediate layer can be inhibited. In addition, the silicon oxide film is reacted with the high-melting point metal in which the generated free energy of its oxide is lower than that of silicon oxide, thereby removing the spontaneous oxide film of silicon. In consequence, cobalt silicide which is less uneven in its surface can be formed.

Next, a method for forming cobalt silicide of the present invention will be described in more detail with reference to drawings in accordance with examples, but the scope of the present invention should not be limited to these examples. Every drawing attached hereto schematically shows a partial section of a semiconductor.

EXAMPLE 1

FIGS. 3A to 3C and FIGS. 4A to 4C are schematic sectional views illustrating the respective steps of a method for forming cobalt silicide of the present invention.

Figure 1:
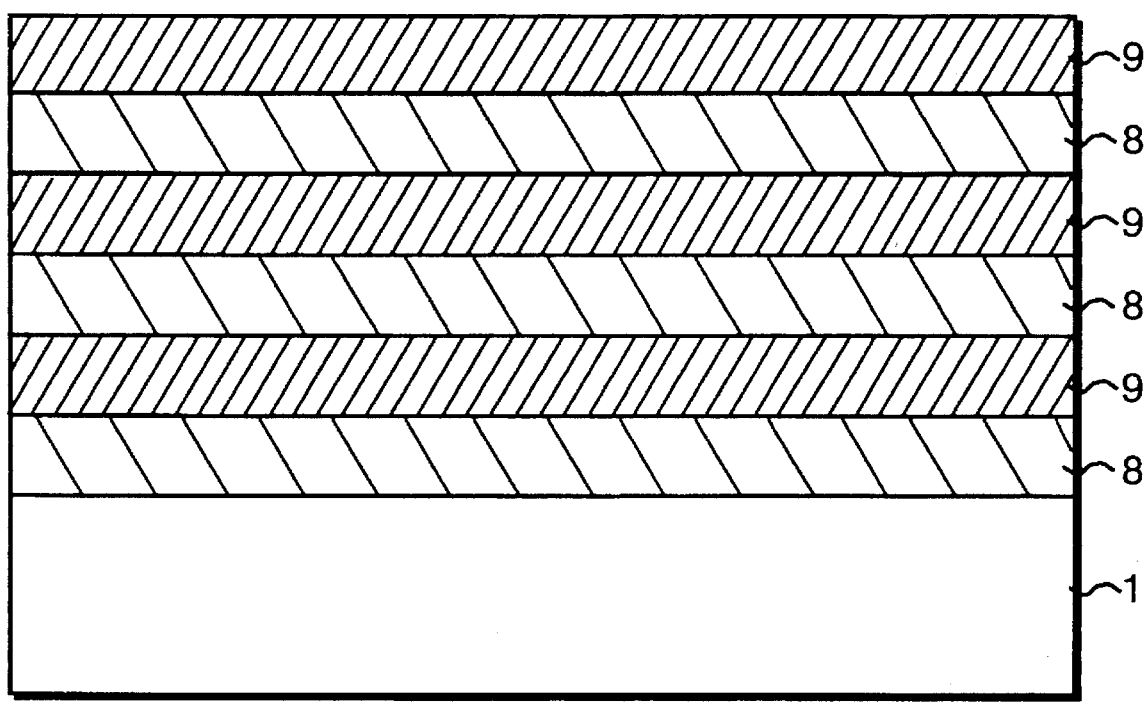
FIG. 1 is a schematic sectional view illustrating a part of a conventional multiple laminate semiconductor obtained by a Co/Ti/Si sputtering process in a prior art.
Figure 2A:
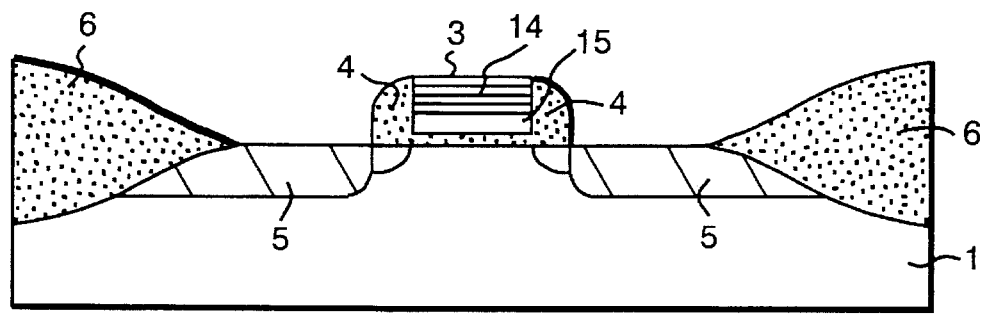
FIG. 2 shows schematic sectional views illustrating a part of a semiconductor element in a conventional method for forming a titanium silicide layer by the utilization of an oxide film in a prior art.
Figure 2B:
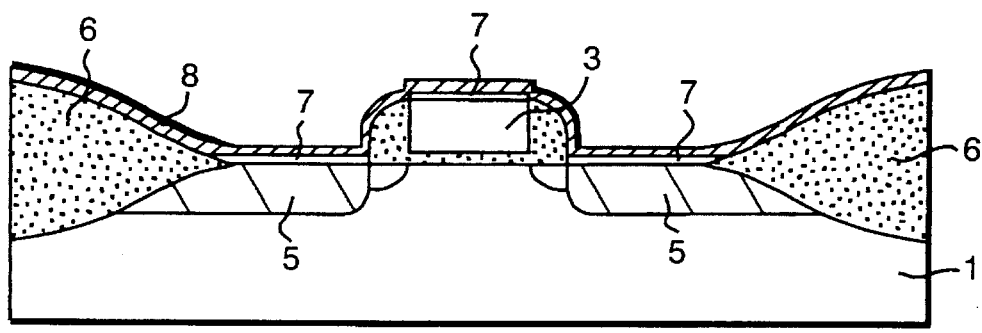
Figure 2C:
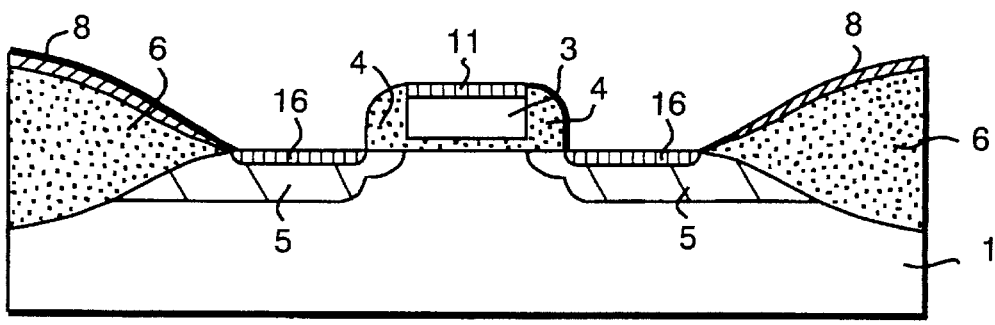
Figure 3A:
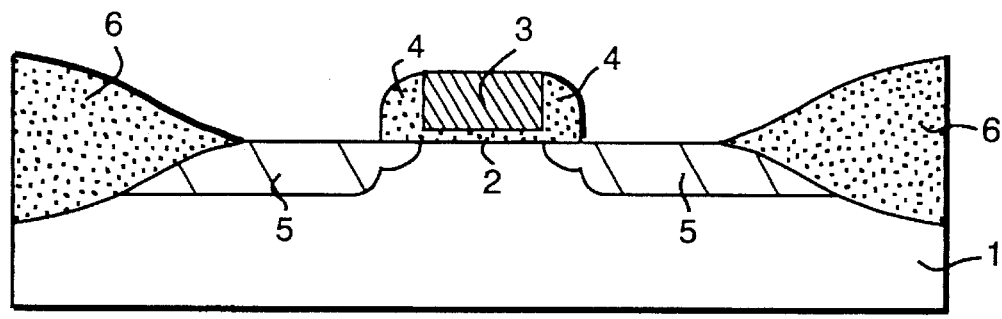
FIG. 3 shows schematic and partially sectional views of an MOS type transistor illustrating the respective steps of a method for forming cobalt silicide regarding the present invention.

As shown in FIG. 3A, an element separating region 6 is formed on a semiconductor substrate 1, and a thermal oxidation treatment is then carried out to form a gate oxidizing film 2. Next, polycrystalline silicon is deposited, and patterning is then carried out to form a polycrystalline silicon gate 3. Afterward, for the formation of an LDD structure, a diffusion layer having a low concentration is formed.

In succession, an oxide film is grown all over, and anisotropic etching is then carried out to form a sidewall 4. Afterward, a highly concentrated diffusion layer having an LDD structure is formed by ion injection, and a heat treatment is then done to form a diffusion layer 5.

Figure 3B:
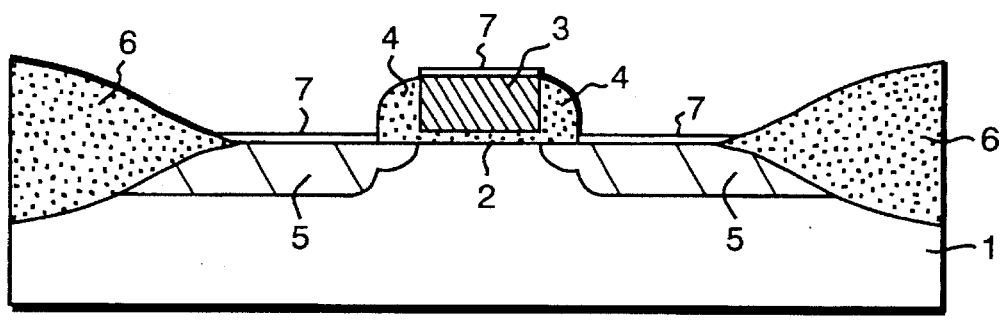

Next, an exposed silicon surface is oxidized to form a silicon oxide film 7 having a thickness of 5 nm or less [see FIG. 3B]. At this time, if the oxide film is too thick, a silicide is not produced.

Figure 3C:
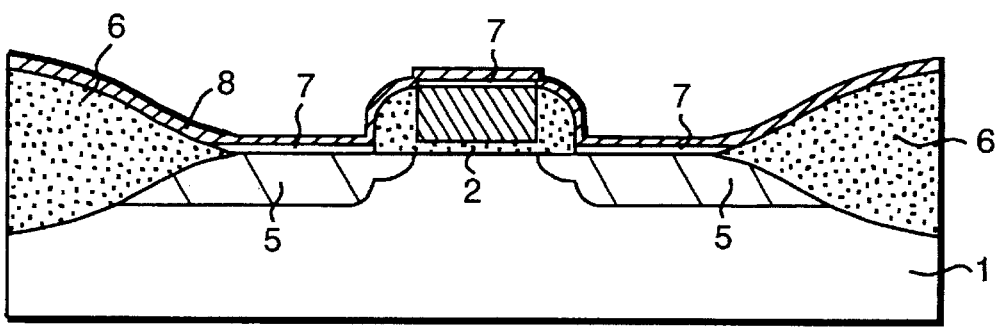

In succession, Ti is sputtered all over to form a Ti layer 8 having a thickness of 10 nm [see FIG. 3C].

The generated free energy of this Ti oxide is $-213.4$ kcal/mole (at 730° C.) and this value is smaller than $-270.4$ kcal/mole (at 730° C.) which is the generated free energy of the silicon oxide film.

Figure 4A:
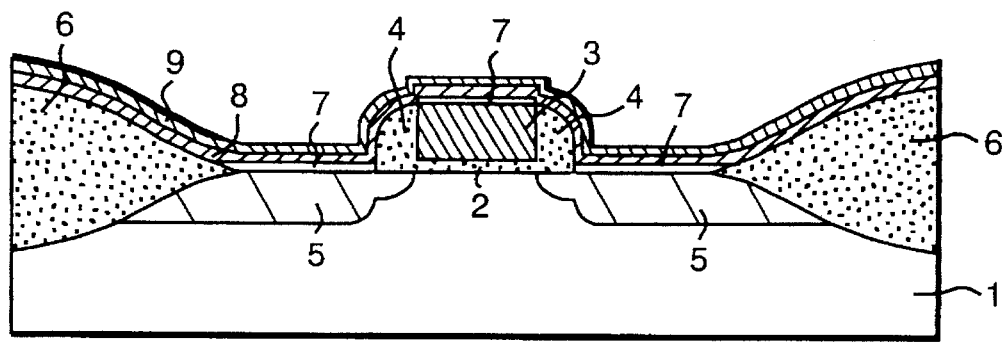
FIG. 4 shows schematic sectional views illustrating the respective steps of the present invention.

Next, Co is sputtered all over to form a Co layer 9 having a thickness of 30 nm [see FIG. 4A].

Successively, a heat treatment is carried out at 750° C. for 30 seconds in a nitrogen atmosphere by the above-mentioned RTA method.

In doing this heat treatment, an initial temperature is set to 200° C., and a temperature rise rate is set to 150° C./sec. In consequence, the reduction reaction of silicon in the silicon oxide film with Ti takes place on the diffusion layer 5, so that Co diffuses in the Ti solid and reaches the surface of the diffusion layer to form a $CoSi_2$ layer 11. Simultaneously, the nitriding of Ti with nitrogen proceeds [see FIG. 4B].

In this case, cobalt silicide is not formed, until the silicon oxide film has been eliminated by the reduction reaction of silicon in the silicon oxide film with Ti.

Accordingly, the $CoSi_2$ layer is formed, reflecting the crystal orientation of the silicon substrate, so that in the interface between Si and the $CoSi_2$ layer, the very flat CoSi2 layer 11 is formed.

As a result of this serial reaction, a TiN layer 10 containing oxygen (hereinafter referred to as "the TiN(O) layer") is formed on the $CoSi_2$ layer 11.

Figure 4B:
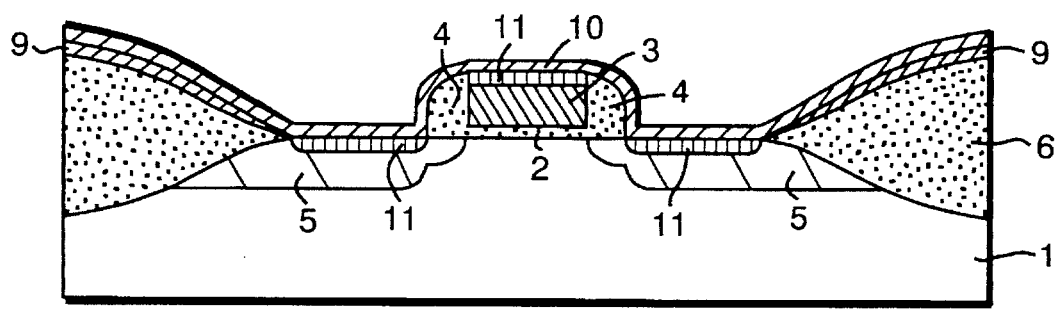
Figure 4C:
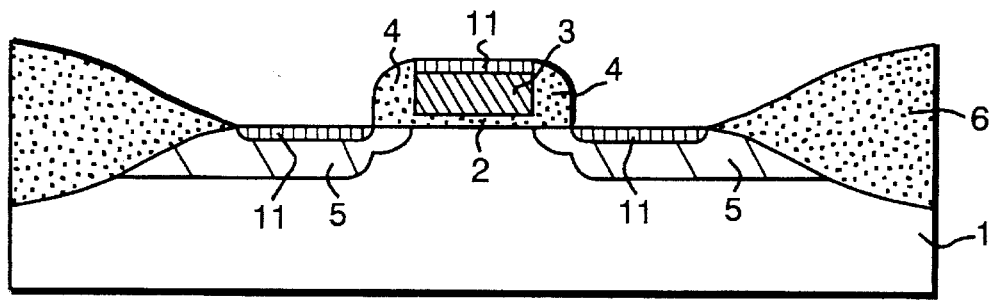

On the other hand, on the uppermost surface on the element separating region 6, the TiN(O) layer 10 is formed, so that the Co layer 9 is present between the TiN(O) layer and the silicon oxide film [see FIG. 4B].

A part of silicon in the silicon oxide film gives rise to reduction reaction with Ti, but if the thickness of Ti is 10 nm or less, the extent of reaction of Ti in subsequent treatment steps is so small as to be regarded as no reaction.

Next, the TiN(O) layer 10 is removed with a mixed aqueous solution of ammonia and hydrogen peroxide, and the unreacted Co layer is selectively etched at a liquid temperature of 50° C. with a mixed solution of 1 part by weight of sulfuric acid, 1 part by weight of nitric acid, 4 parts by weight of phosphoric acid and 4 parts by weight of acetic acid. According to the above-mentioned treatments, the CoSi2 layer 11 can be formed in a self-matching state on the diffusion layer 5 [see FIG. 4C].

EXAMPLE 2

Example 1 has described an example where a $CoSi_2$ layer 11 is formed on a diffusion layer 5, but about the same structure as in Example 1 can be formed in a contact portion.

FIG. 5 shows the second example of the present invention, but this example will be described with reference to this drawing.

Figure 5A:
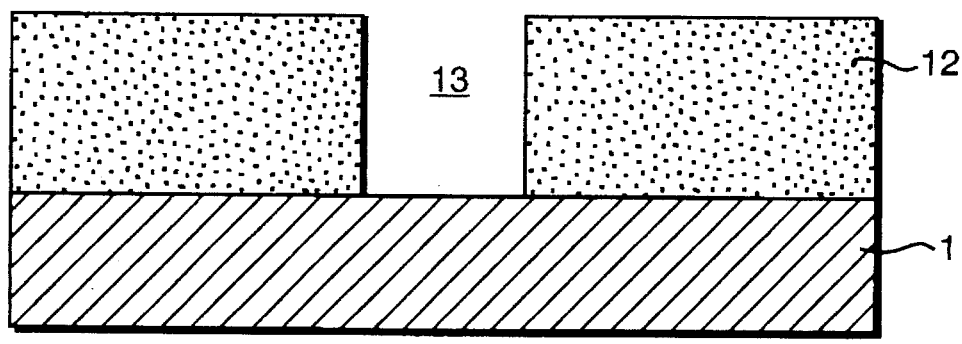
FIG. 5 shows schematic sectional views of a contact portion illustrating the steps in Example 2 of the present invention.
Figure 5B:
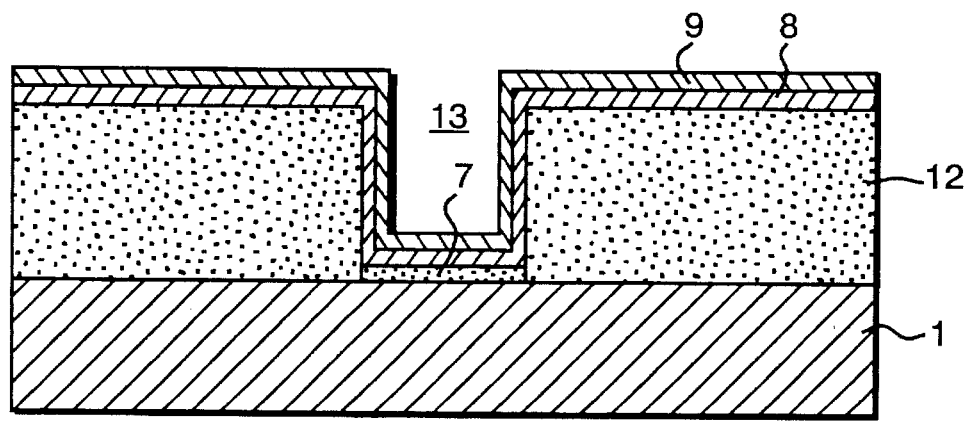
Figure 5C:
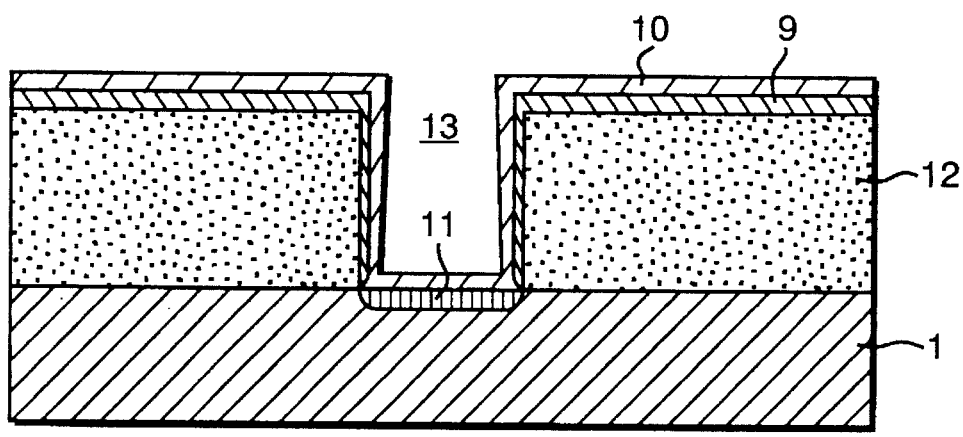

As shown in FIG. 5A, an interlayer film 12 is formed on a semiconductor substrate 1, and a contact hole 13 is then formed. In succession, as shown in FIG. 5B, an oxide layer 7 having a thickness of 5 nm or less is formed on a silicon surface exposed on the bottom of the contact hole. Afterward, Ti is sputtered all over so that its thickness may be 10 nm, thereby forming a Ti layer 8. Next, Co is sputtered all over to form a Co layer 9 of 30 nm in thickness.

After the structure shown in FIG. 5B has been built up, a heat treatment is carried out at 750° C. for 30 seconds in accordance with a RTA method. This heat treatment is done under conditions of an initial temperature of 200° C. and a temperature rise rate of 150° C./sec. In consequence, on the bottom of the contact hole 13, the reduction reaction of silicon in a silicon oxide film with Ti occurs, and Co diffuses in the Ti solid and reaches the surface of a diffusion layer to form a $CoSi_2$ layer 11. Simultaneously, the nitriding of Ti with nitrogen proceeds [see FIG. 5C].

In this case, cobalt silicide is not formed, until the silicon oxide film has been eliminated by the reduction reaction of silicon in the silicon oxide film with Ti.

Accordingly, the $CoSi_2$ layer is formed, reflecting the crystal orientation of the silicon substrate, so that in the interface between Si and the $CoSi_2$ layer, the very flat $CoSi_2$ layer 11 is formed.

As a result of this serial reaction, a TiN(O) layer 10 containing oxygen is formed on the $CoSi_2$ layer 11.

On the other hand, on an interlayer film 12, the TiN(O) layer 10 is formed as an uppermost surface, so that the Co layer 9 is present between the TiN(O) layer and the silicon oxide film. A part of silicon in the silicon oxide film gives rise to reduction reaction with Ti, but if the thickness of Ti is 10 nm or less, the extent of reaction of Ti in subsequent treatment steps is so small as to be regarded as no reaction.

Next, the TiN(O) layer 10 is removed with a mixed aqueous solution of ammonia and hydrogen peroxide, and for example, an Al—Si—Cu alloy or the like is sputtered to form a wire, whereby a contact which is less uneven and has a low contact resistance can be formed.

The method for forming the cobalt silicide of the present invention has been described above in accordance with the examples, and in the examples, Ti has been utilized as the high-melting point metal in which the generated free energy of its oxide is lower than that of the silicon oxide film. However, even when Zr is used in addition to Ti, a similar effect can be obtained.

According to the present invention, some remarkable effects can be exerted. For example, a process can be simplified, and a cobalt silicide film which is less uneven in its surface and is excellent in crystal orientation can be selectively formed. Furthermore, a contact can be formed which is less uneven and has a low contact resistance.

What is claimed is:

1. A method for manufacturing a semiconductor device comprising a cobalt silicide film, said method comprising supplying a silicon single crystal substrate, thermally oxidizing said substrate to form a silicon oxide layer followed by a step of depositing a high melting point metal in which the generated free energy of its oxide is lower than that of said silicon oxide, and then depositing Co, followed by heat treatment to form $CoSi_2$, wherein the silicon oxide layer is formed with a thickness which is sufficient to prevent a reaction of said Co with said formed silicon oxide layer during said heat treatment.

2. The method for manufacturing a semiconductor device according to claim 1, wherein the high-melting point metal in which the generated free energy of its oxide is lower than that of silicon oxide is Ti or Zr.

3. The method for manufacturing a semiconductor device according to claim 1, wherein the deposition of the high-melting point metal and the deposition of Co are carried out by a sputtering process.

4. The method for manufacturing a semiconductor device according to claim 1, wherein the silicon oxide layer is formed with a thickness of not greater than 5 nm.

* * * * *